(12) United States Patent
Hixson et al.

(10) Patent No.: US 6,736,946 B2
(45) Date of Patent: May 18, 2004

(54) PHYSICAL VAPOR DEPOSITION APPARATUS WITH MODIFIED SHUTTER DISK AND COVER RING

(75) Inventors: Robert B. Hixson, Portland, OR (US); Jason L. Monfort, Hillsboro, OR (US); Gary W. Groshong, Brentwood, CA (US); Jose Luis Gonzalez, Oakland, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 113 days.

(21) Appl. No.: 10/183,924

(22) Filed: Jun. 25, 2002

(65) Prior Publication Data

US 2002/0166762 A1 Nov. 14, 2002

Related U.S. Application Data

(62) Division of application No. 09/755,545, filed on Jan. 5, 2001, now Pat. No. 6,440,879.

(51) Int. Cl.7 .............................................. C23C 14/34
(52) U.S. Cl. ............................. 204/298.11; 204/298.23; 204/298.29
(58) Field of Search ....................... 204/298.11, 298.15, 204/298.23, 298.29; 118/720, 721, 504, 505

(56) References Cited

U.S. PATENT DOCUMENTS

| | | | |
|---|---|---|---|
| 5,358,615 A | 10/1994 | Grant et al. | 204/192.15 |
| 5,772,858 A | 6/1998 | Tepman | 204/192.12 |
| 5,943,588 A | 8/1999 | Watrobski et al. | 438/401 |
| 6,051,113 A | 4/2000 | Moslehi | 204/192.12 |
| 6,176,978 B1 * | 1/2001 | Ngan | 204/192.12 |

OTHER PUBLICATIONS

Endura® HP PVD™, Shutter Chamber Option, Applied Materials, Sep. 1996, Chapter 2, pp. 2–1 through 2–6.

* cited by examiner

Primary Examiner—Rodney G. McDonald
(74) Attorney, Agent, or Firm—Marger, Johnson & McCollom P.C.

(57) ABSTRACT

Physical vapor deposition (PVD) system comprises a chamber, an upper shield and a lower shield mounted within the chamber, a cover ring having one or more tabs extending radially inwardly therefrom. The PAD system further includes a shutter disk having one or more notched areas formed in the periphery thereof to receive non-contacting the one or more tabs of the cover ring. The cover ring has two or more recesses formed in an upper side thereof with a guide pin extending from the center of the recesses. The lower shield has two or more cups with a hole therein to be engaged with the guide pin of the cover ring to keep the lower shield from rotating with respect to the cover ring. The cups of the lower shield are inserted into the recesses of the cover ring. These improvements enable a standard shutter arm assembly and a shutter disk to be utilized in a two-tab block-out scheme.

7 Claims, 6 Drawing Sheets

PHYSICAL VAPOR DEPOSITION APPARATUS WITH MODIFIED SHUTTER DISK AND COVER RING

This application is a divisional of prior application Ser. No. 09/755,545, filed Jan. 5, 2001 now U.S. Pat. 6,440,879.

BACKGROUND OF THE INVENTION

1. Field of the Invention

This invention relates generally to the field of fabrication of semiconductor devices and, more particularly, to a physical-vapor deposition (PVD) apparatus and method of using the apparatus.

2. Description of the Related Art

Sputtering, a type of physical vapor deposition, is widely used in semiconductor manufacturing to deposit thin metal or insulating films on semiconductor wafers.

Conventional sputtering apparatus 11 shown in FIG. 1 includes a process chamber 10 enclosing a target 12 affixed to the top thereof and a wafer pedestal 14 where a semiconductor wafer 16 rests during deposition. The target 12 is formed of a deposition material to be deposited. A lower shield 18 and an upper shield 20 are positioned within the chamber 10 such that they are electrically insulated from the chamber 10 and able to take on a floating electrical potential associated with the potential of the plasma of a gas, e.g. argon, generated within the chamber 10. Additionally, a cover ring 22 is engaged with the lower shield 18 to keep any deposition material from being deposited on the peripheral margin of the wafer 16.

During sputter deposition, the target 12 is bombarded by plasma ions within the chamber 10 by applying an appropriate voltage to the target 12, which causes particles of target material to be ejected from the target 12 toward the wafer 16. These particles deposit on the wafer 16 to form a desired film. During the deposition, however, particles of target can also deposit on the interior surfaces of the lower and upper shields 18 and 20. Also, a portion of the particles returns to the target 12 itself.

For these reasons, after a number of wafers are processed, the sputtering shields become coated with highly stressed, brittle barrier metal films, e.g., of TiN. Without proper treatment, these films can delaminated, flake off, and shower the substrate with particles.

Thus, it is necessary to coat the shields occasionally with metal such as titanium to prevent such participation. This process is called "pasting." A pasting material, such as titanium, is sputtered around the interior of the shields 18 and 20 along with the target 12. The layer of pasting material deposited onto the interior of the shields 18 and 20 forms a barrier to cracking and flaking between the layers of the high stress material. The pasting material such as titanium acts as a glue layer to secure the already-deposited films and to provide an adherent surface for any additional material particulate. The pasting material deposited on the target 12 must be cleaned before a normal sputtering process begins.

Conventionally, a standard shutter disk 24 and a shutter arm assembly 26 are used during pasting and cleaning of the target 12. Typically, the shutter disk 24 is housed in an enclosure 30 attached to the side of the process chamber 10. The shutter disk 24 is positioned between the pedestal 14 and the target 12 to isolate the target 12, and to protect other areas of the chamber 10 from subsequent cleaning of the target 12 and the pasting material. The shutter disk 24 is mounted on a rotating arm 32, i.e., an actuator arm, which is located outside the shield 18 and within the process chamber 10. When signaled to do so, the shutter arm assembly 26 rotates the disk 24 into the process chamber 10, overlying the wafer pedestal 14. The shutter disk 24 can then be raised into a pasting process position (at the same level as the wafer 16) by a wafer lift 34. Thus, cleaning of the target (sputtering away any contaminants present on the surface of target 12 onto the disk 24) or pasting without contaminating the surface of wafer pedestal 14 is possible because the wafer pedestal surface is protected by the shutter disk 24. When cleaning or pasting is completed, the shutter disk 24 returns to the storage position.

In semiconductor manufacturing, it is important to align a subsequent layer to a previous underlying layer. For this reason, alignment marks 37 (FIG. 2B) are typically formed on a wafer or on a reticule for alignment between various layers. The alignment marks are typically formed by etching a depth into a wafer. The alignment of one layer to the next is typically accomplished using a stepper. The stepper uses a laser beam to detect the position of the alignment marks on the wafer. It becomes difficult to maintain these alignment marks, especially in the back end of the manufacturing process, as the deposition over the marks makes the marks indistinguishable.

Recently, to protect the alignment marks from being damaged or contaminated by deposition, a two-tabbed alignment block-out scheme has been introduced. One of the process chambers incorporating the two-tabbed alignment block-out scheme is Endure Model (model number ENDURE® HP PVD™), available commercially from Applied Materials, Inc.

As illustrated in FIG. 2A, a cover ring 22' has two tabs 35 protruding therefrom so that it can cover or protect alignment marks 37 of FIG. 2B on a semiconductor wafer 16' during regular deposition steps. Alignment marks 37 positioned beneath the tabs 35 can be protected. As a result, the alignment marks 37 can be better maintained during deposition, and of course better alignment is possible with well-maintained alignment marks 37.

As shown in FIG. 2C, which is a cross-sectional view of a conventional cover ring taken in line 2C—2C of FIG. 2A, pins 38 are formed in the bottom of the cover ring 22' in accordance with the two-tabbed alignment block-out scheme.

As illustrated in FIG. 2D, the cover ring 22' is engaged with the lower shield 18. The pins 38 extending down from the bottom of the cover ring 22' are engaged in the holes 42 in a cup 19 formed under the lower shield 18. This keeps the cover ring 22' from rotating so that the cover ring 22' with tabs 35 can be precisely fixed in place with respect to alignment marks 37 formed on a wafer 16.

However, conventional tabbed alignment block-out hardware with the cover ring 22' and the lower shield 18 cannot use a standard shutter disk and shutter arm assembly because the pins 38 of the cover ring 22' would interfere with the shutter disk 24 as indicated at 27 of FIG. 1. Particularly, if an actuator arm 25 were to attempt to put the shutter disk 24 onto the wafer pedestal 14, the shutter blade 32 would run into the pins 38 extending down from the lower shield 18.

Thus, there would be a clearance problem underneath the lower shield 18 if the shutter disk 24 were used with the two-tabbed block-out scheme.

Further, because the shutter disk 24 has to be sufficiently thick (to withstand various processing conditions), it can be inadvertently adhered to the tabs 35 by deposition during the pasting or the cleaning steps as illustrated in FIG. 3.

Therefore, production wafers instead have been used for pasting by transferring the production wafers into the chamber and pasting on the wafers to avoid the clearance and gluing problems.

Unfortunately, using expensive production wafers each time to paste the chamber (which is required before each production lot) is costly and time consuming. Particularly, this is true because operator intervention is necessary to place an extra wafer in each production lot, leading to otherwise unnecessary exposure to miss-processing and it takes a long time to transfer the wafer to the chamber to be pasted. Also, because pasting is required quite often for the PVD chamber, a large number of production wafers can be wasted. Alternatively to using a wafer for pasting, an additional chamber having a metal disk for shattering can be attached to the main chamber body and a robot arm can be used to pick up the disk and to transfer it to the chamber for pasting or cleaning of the target.

However, these prior art methods for cleaning targets or pasting deposition chambers significantly reduce throughput because they require significant non-productive down-time to transfer paste wafers from another location into the chamber for pasting. Also, in addition to the down time to transfer the metal disk to the pasting or the cleaning position, the metal disk for shattering can stress the robot arm joints, thereby wearing out the robot arm assembly.

Accordingly, a need remains for a new sputtering apparatus that allows the use of a shutter and shutter arm assembly that do not require long down time to transfer a wafer or a shutter disk into the pasting or cleaning position, thereby improving the throughput without problems noted above.

SUMMARY OF THE INVENTION

The present invention provides a new sputtering apparatus that allow the use of a shutter disk and shutter arm assembly for pasting in a two-tab blackout scheme, thereby improving productivity and reducing waste of production wafers.

According to the present invention, physical vapor deposition (PVD) system comprises a chamber, an upper shield and a lower shield mounted within the chamber, a cover ring having one or more tabs extending radially inwardly therefrom. The PVD system further includes a shutter disk having one or more notched areas formed in the periphery thereof to receive the one or more tabs of the cover ring. The cover ring has two or more recesses formed in an upper side thereof with a guide pin extending from the center of the recesses. The lower shield has two or more cups with a hole therein to be engaged with the guide pin of the cover ring to keep the lower shield from rotating with respect to the cover ring. The cups of the lower shield are inserted into the recesses of the cover ring. A wafer pedestal is mounted within the chamber. Additionally, the PVD system includes means for rotating the shutter disk to place the shutter disk on the wafer pedestal; and means for vertically adjusting the height of wafer pedestal.

With the shutter disk having notched areas and the modified cover ring, the present invention allows use of the shutter disk and shutter arm assembly without a clearance problem underneath the lower shield and without a gluing problem in a tabbed alignment block-out scheme. Thus, the present invention can be fully automated and significantly improve productivity.

The foregoing and other objects, features and advantages of the invention will become more readily apparent from the following detailed description of a preferred embodiment of the invention that proceeds with reference to the accompanying drawings.

DETAILED DESCRIPTION

In the following description, numerous specific details are set forth to provide a thorough understanding of the present invention. However, one having ordinary skill in the art should recognize that the invention can be practiced without these specific details. In some instances, well-known process steps, device structures, and techniques have not been shown in detail to avoid obscuring the present invention.

Figure 1:
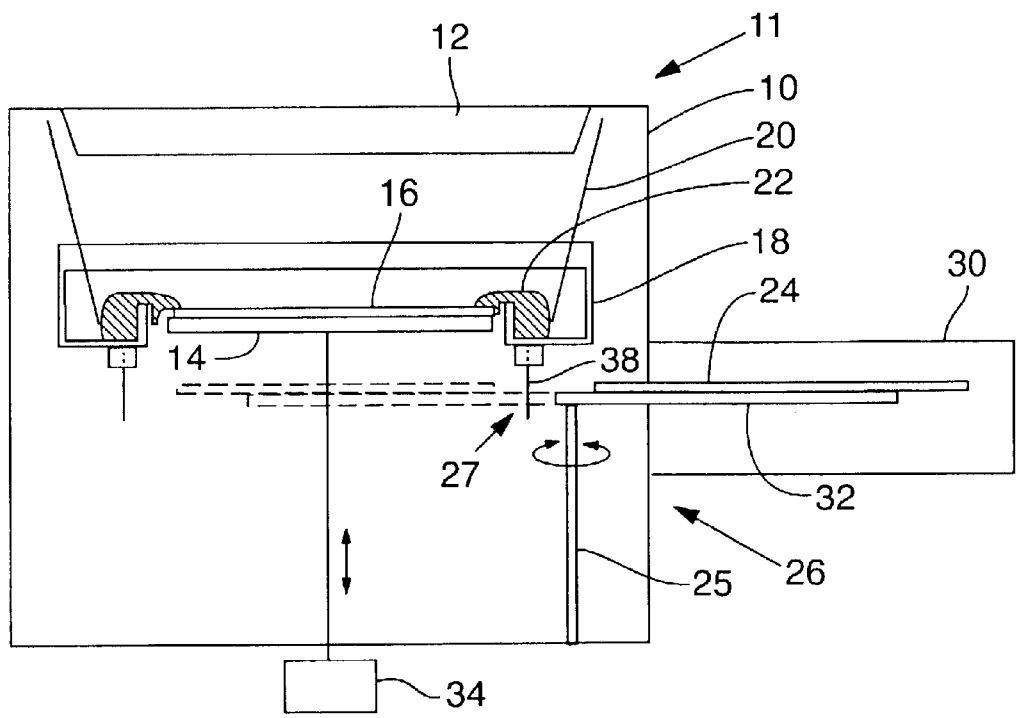
FIG. 1 is a schematic diagram of a conventional physical vapor deposition (PVD) apparatus with a conventional shutter and shutter assembly.

The invention can be implemented as a modification to a conventional PVD system shown in FIG. 1, as shown in FIGS. 4 to 8B. Common elements are indicated by the similar reference numerals. A physical vapor deposition (PVD) system of the present invention comprises a chamber 10', an upper shield 20' and a lower shield 48 mounted within the chamber 10', and a cover ring 42 having one or more tabs 40 extending radially inwardly therefrom. The cover ring 42 includes two or more recesses 44 formed in an upper side thereof with guide pins 45, 46 extending from the center of the recesses 44. The lower shield 48 has two or more cups 50 with a hole 51 therein to be engaged with the guide pins 45, 46 of the cover ring 42 to keep the lower shield 48 from rotating with respect to the cover ring 42, the cups 50 of the lower shield 48 being inserted into the recesses 44 of the cover ring 42.

Importantly, one or more notched areas 39 are formed in the periphery of the shutter disk 36 to receive one or more tabs 40 of the cover ring 42. Thus, with the features described above, the cover ring 42 and the tabs 40, and the shutter disk 36 and notched areas 39 can be fixed in angular registration.

As is known in the art, a wafer pedestal 14' is mounted within the chamber 10' and the means 26' for rotating the shutter disk is provided to place the shutter disk on the wafer pedestal. Also, means 34 for vertically adjusting the height of wafer pedestal is provided.

Figure 4:
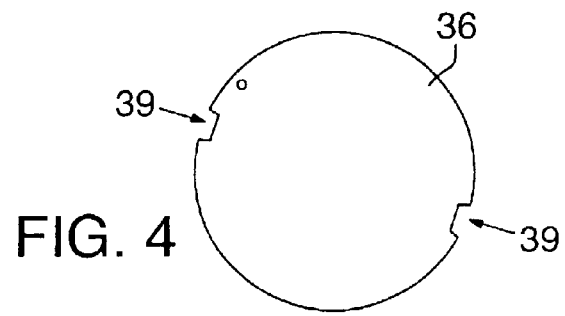
FIG. 4 is a plan view of a shutter disk in accordance with the present invention.
Figure 5A:
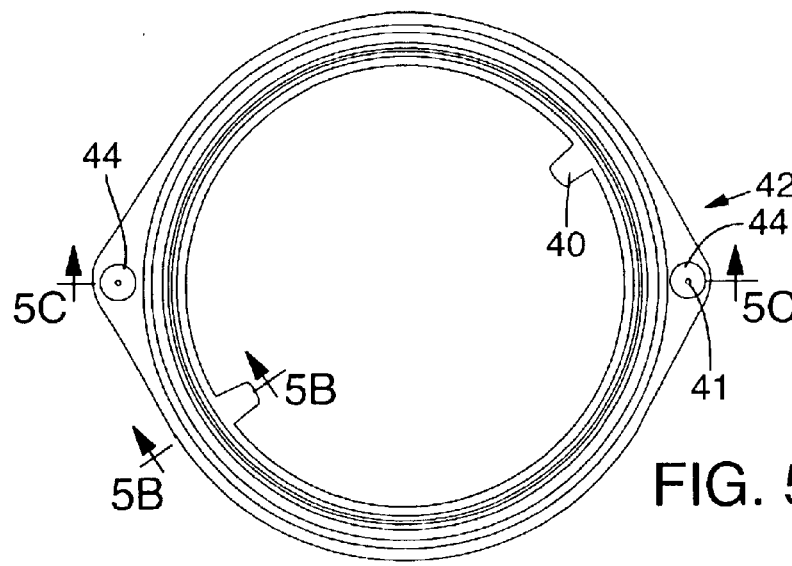
FIG. 5A is a top plan view of a cover ring in accordance with the present invention with cups formed on an upper side of the cover ring.
Figure 5B:
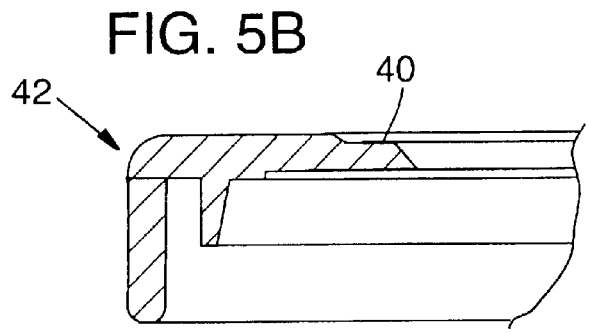
FIG. 5B is an inverted cross-sectional view taken along line 5B—5B of FIG. 5A.
Figure 5C:
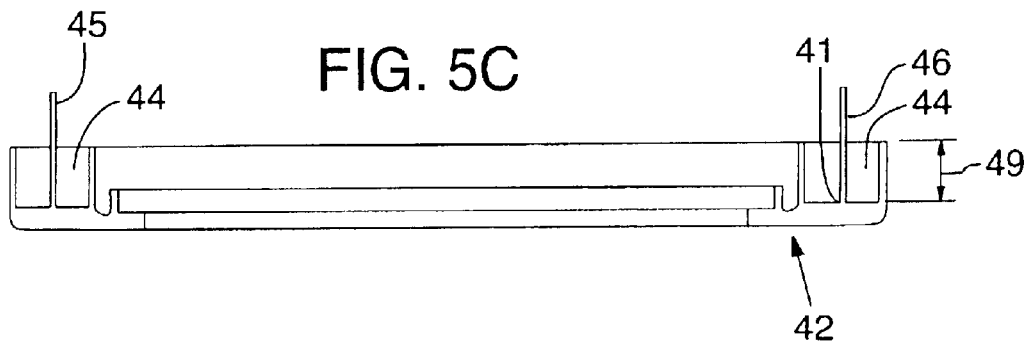
FIG. 5C is a cross-sectional view taken along line 5C—5C of FIG. 5A
Figure 8A:
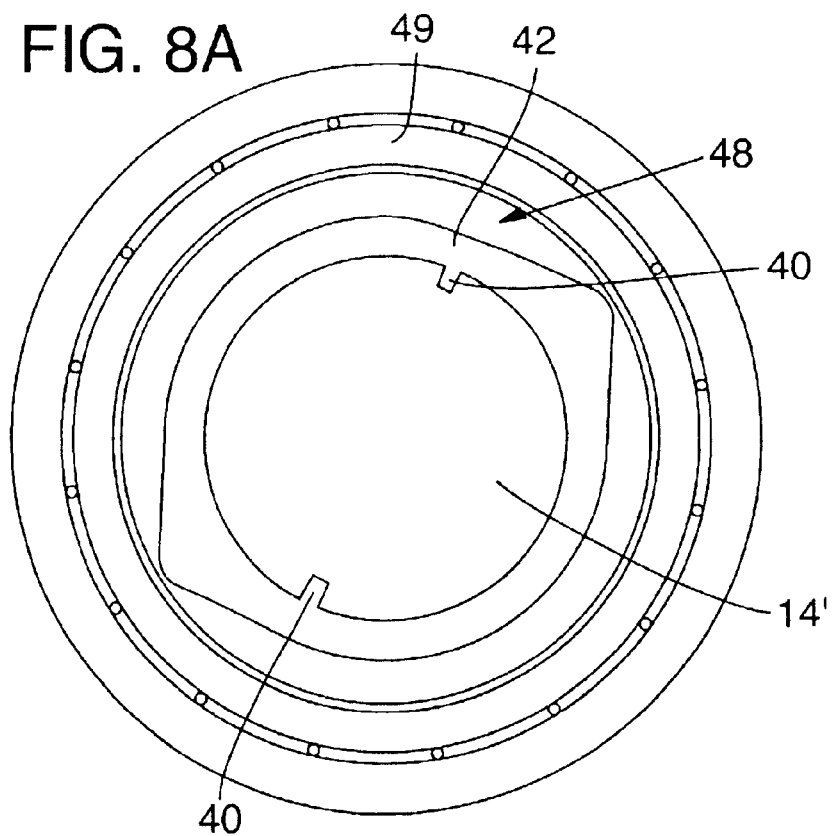
FIG. 8A is a top view of a PVD chamber according to the present invention with the shutter disk in a stored position.
Figure 8B:
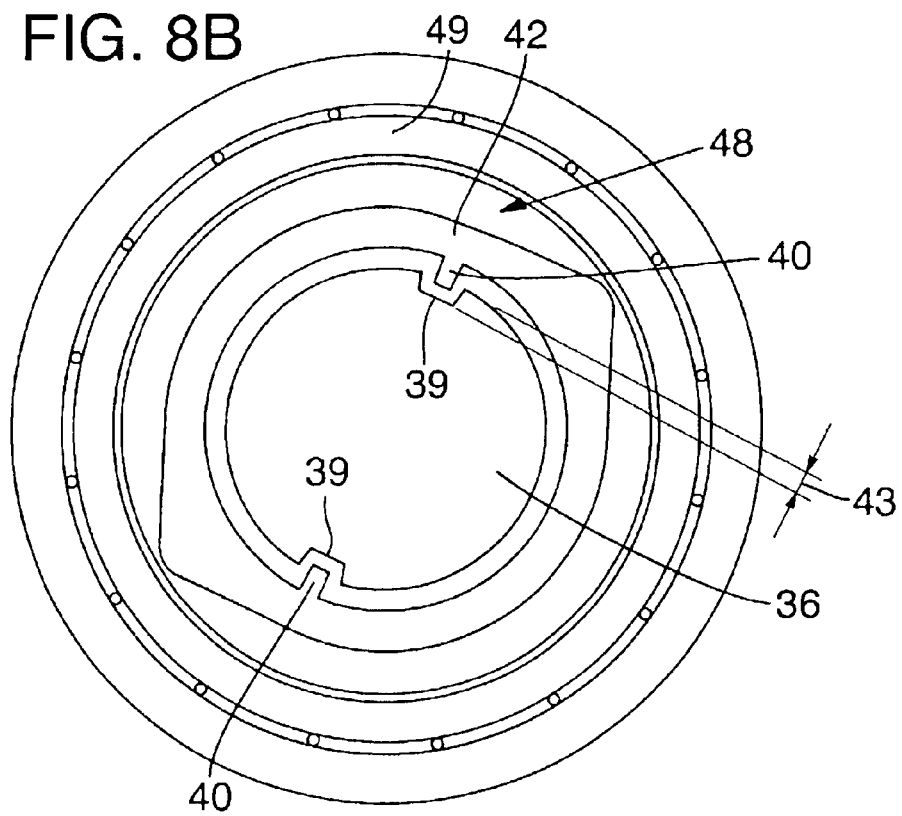
FIG. 8B is a top view of a PVD chamber according to the present invention with the shutter disk in the pasting position.

The preferred embodiment of the present invention comprises a shutter disk 36 that is shown in FIG. 4 and FIG. 8B. As described above, the shutter disk 36 includes notched areas 39 to solve the problems of the prior art. FIGS. 5A–5C show a cover ring 42 according to one embodiment of the present invention. The cover ring 42 has one or more tabs 40 extending radially inwardly therefrom on the edge or periphery thereof in accordance with a two-tabbed block-out scheme, as shown in FIGS. 8A–8B. The notched areas 39 of the shutter disk 36 receive one or more tabs 40 of the cover ring 42 to keep a lateral distance 43 between the tab 40 and the shutter disk 36, when the shutter disk 36 is in a pasting position as illustrated in FIG. 8B. Preferably, the distance 43 is approximately 0.3 centimeters to approximately 0.8 centimeters (approximately 0.1 inch to approximately 0.3 inches). Therefore, the cover ring 42 including the one or more tabs 42 and the shutter disk 36 do not contact each other but should be spaced sufficiently apart to avoid gluing. Consequently, in the present invention, because the sufficient distance is maintained between the cover ring 42 and the shutter disk 36, an inadvertent gluing problem between the shutter disk 36 and the tabs 40, shown in the prior art, can be prevented.

The use of clamp ring is thus not recommended for the purpose of the present invention because the clamp ring restrains the wafer by clamping or contacting the wafer. Thus, it is not suitable for a pasting process under two-tab block-out scheme, where the cover ring having tabs and the shutter disk should not contact each other.

Although the present invention is described and illustrated with the cover ring 42 having two tabs 40 and the shutter disk 36 having two notched areas 39, the shutter disk 36 and the cover ring 42 could be further modified to allow for different orientations or numbers of tabs on the cover ring 42.

For the reasons described above, with a shutter disk having notched areas, one of the problems of the prior art, a gluing problem between the tabs and the shutter disk, can be avoided. Thus, the novel shutter disk design of the present invention allows the shutter disk and shutter arm assembly to be used with a tabbed alignment block-out scheme.

FIGS. 5A–5C and 6A–6C illustrate preferred embodiments of the present invention to avoid the clearance problem underneath the lower shield 18 indicated at 27 of FIG. 1, in which the shutter arm assembly 26, particularly, shutter blade 32, would run into the pins 38 extending down from the lower shield 18 if the shutter disk 24 were used with the two-tabbed block out scheme in conventional apparatus.

As discussed above, the annular cover ring 42, shown in FIG. 5A, of the present invention includes one or more tabs 40 extending radially inwardly therefrom. FIG. 5B is an upside-down cross-sectional view taken along line 5B—5B of FIG. 5A to show the tabs 40 of the cover ring 42 to protect alignment marks formed on a semiconductor wafer in accordance with the two-tabbed block-out scheme.

To further illustrate the present invention, FIG. 5C shows a cross-sectional view taken along line 5C—5C of FIG. 5A. In particular, the cover ring 42 includes two (or more) recesses 44 on an upper side of the cover ring 42 with guide pins 45, 46 extending from the center of the recesses 44. The recesses 44 are formed by a cylindrical wall molded into ears on the periphery of the cover ring 42. The recesses 44 are sized to receive cups 50. A suitable diameter of recesses 44 is approximately 1.0 inch (2.5 centimeters). The guide pins 45, 46 are removably mounted, e.g. screwed, into holes 41 of the cover ring 42. The lengths of the guide pins 45, 46 are approximately 5.1 centimeters and 3.2 centimeters, respectively.

Figure 6A:
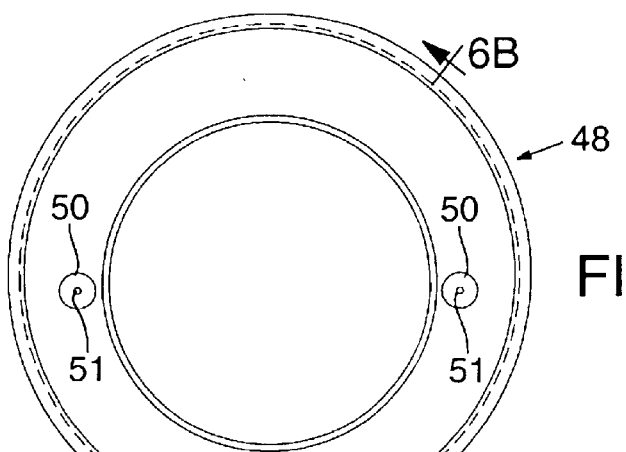
FIG. 6A is a top plan view showing a lower shield in accordance with one embodiment of the present invention.
Figure 6B:
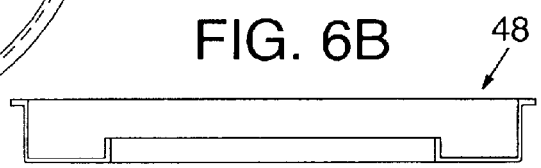
FIG. 6B is a cross-sectional view taken along line 6B—6B of FIG. 6A.
Figure 6C:
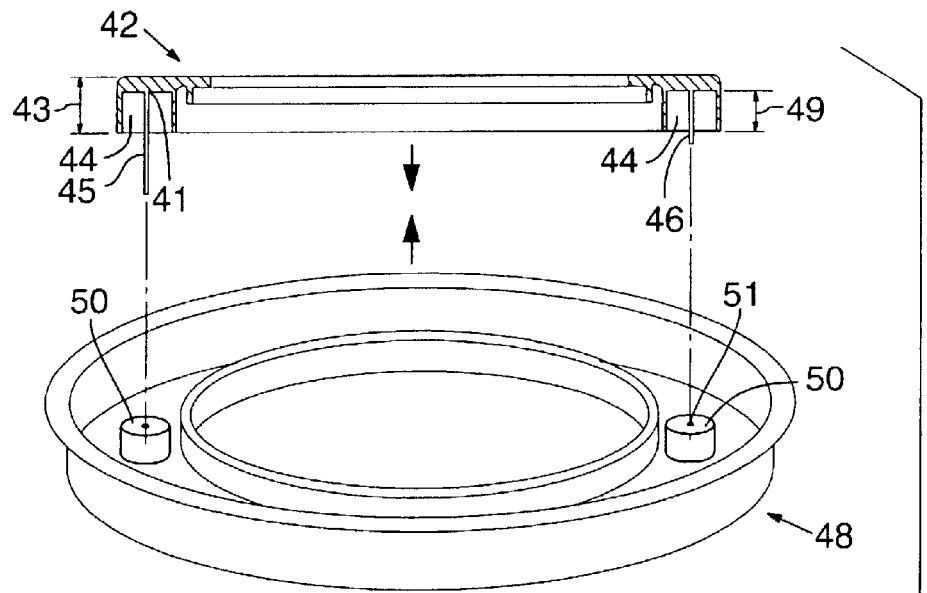
FIG. 6C is a schematic illustrating the concept of the present invention to eliminate the clearance problem underneath the lower shield of the prior art.
Figure 6C:
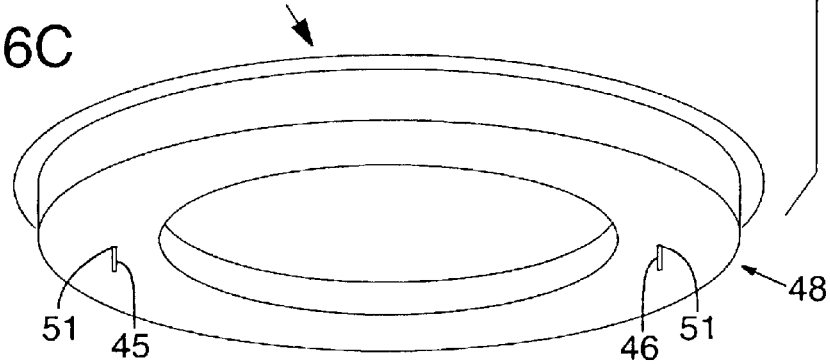

FIG. 6A shows a lower shield 48 in accordance with one embodiment of the present invention. FIG. 6B is a cross-sectional view of the lower shield 48 taken along line 6B—6B of FIG. 6A. The lower shield 48 includes two or more annular cups 50 having a hole 51 to receive and engage the guide pins 45, 46 of the cover ring 42 in the recesses 44, as illustrated in FIG. 6C. This keeps the lower shield 48 from rotating with respect to the cover ring 42. The cups 50 of the lower shield 48 are inserted into the recesses 44. (See FIG. 7B) The height of cups 50 is sufficient so that the rotation of the cover ring 42 with respect to the lower shield 48 can be prevented. The depth 49 of the cover ring 42 is' approximately 0.9 inches (2.5 centimeters). These features are important for precisely aligning the tabs 42 and the alignment marks 37.

Figure 2A:
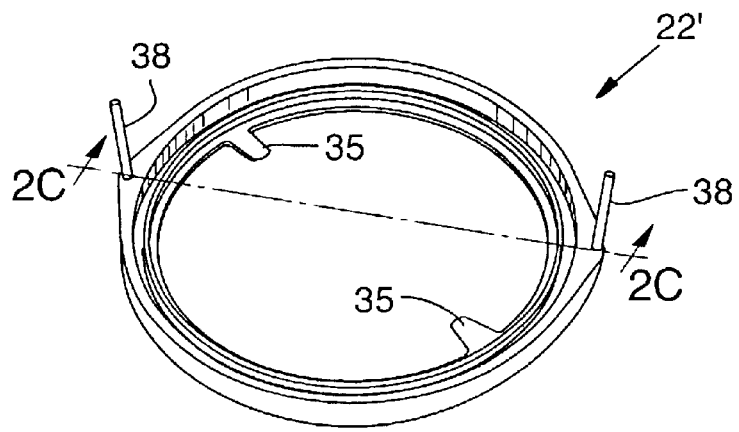
FIG. 2A is a perspective view of a cover ring and a lower shield used in a conventional two-tabbed block-out scheme.
Figure 2B:
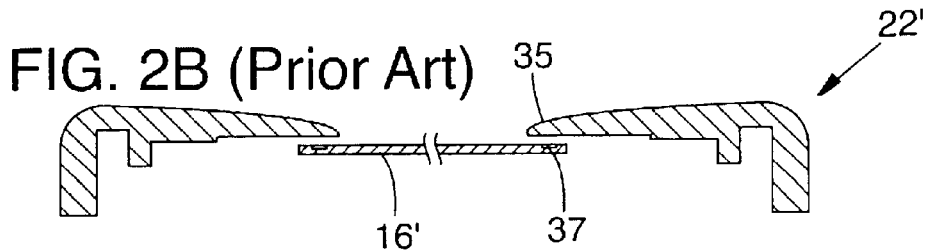
FIG. 2B is a cross-sectional view of a conventional cover ring of FIG. 2A overlying alignment marks formed on a process wafer.
Figure 2C:
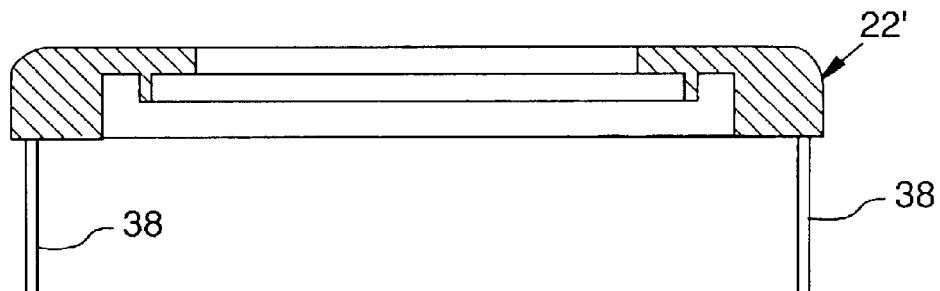
FIG. 2C is a cross-sectional view of a conventional cover ring taken in line 2C—2C of FIG. 2A.
Figure 2D:
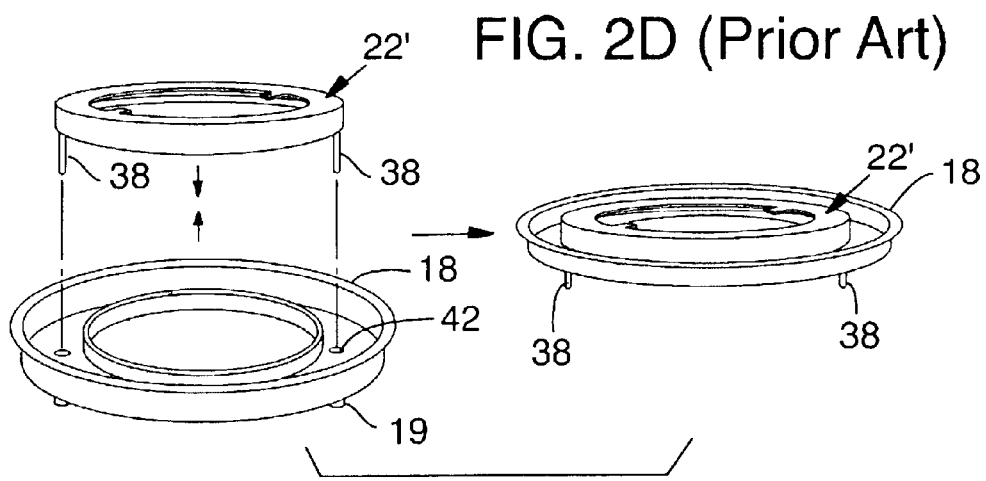
FIG. 2D is a schematic diagram illustrating a clearance problem underneath the lower shield in accordance with the prior art.
Figure 3:
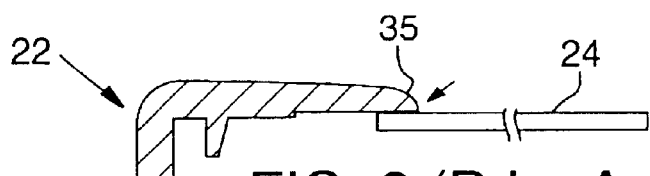
FIG. 3 is a cross-sectional view illustrating gluing between a conventional shutter disk and tabs from the conventional two-tabbed block-out scheme.

Importantly, as indicated in FIG. 6C, when the cover ring 42 is engaged with the lower shield 48, because the cover ring 42 has recesses 44 on the upper side thereof and the guide pin 46 extends from the bottom of the recesses 44, the pin 46 does not protrude from the bottom of the lower shield 51 compared to the prior art shown in FIGS. 2A, 2C and 2D. Thus, it is possible to give full clearance when an actuator arm attempts to place the shutter disk 36 into the pasting position. See FIG. 7B, which illustrates this vertical clearance.

Positions of the guide pins 45, 46 and cups 50 can be modified to allow for different orientations or numbers of tabs on the cover ring 42. These may be necessary for alternate implementations of the alignment scheme. Additional modifications of the position and configuration of the cup 50 could be made and still allow for shutter disk and shutter arm assembly operation within the spirit and scope of the invention.

Figure 7A:
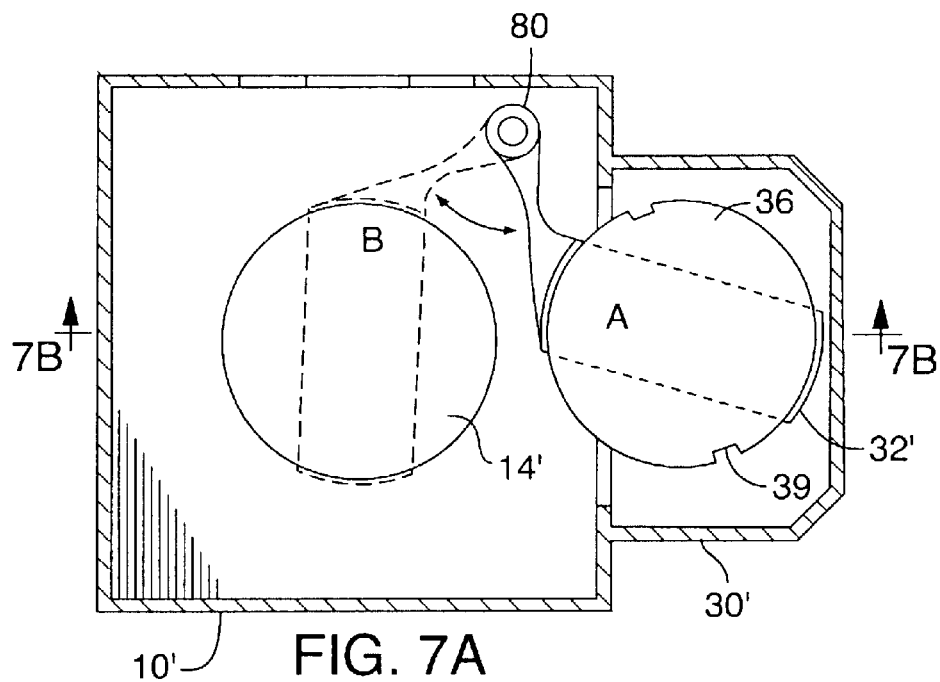
FIG. 7A is a plan view of the present invention illustrating lateral movement of a shutter arm assembly to reposition the shutter disk from an enclosure onto a wafer pedestal.

FIG. 7A illustrates the movement of a shutter arm assembly to place the shutter disk 36 from an enclosure 30' onto a wafer pedestal 14'. In detail, the shutter disk 36 rests on a shutter blade 32' within the enclosure 30'. The shutter disk 36 is pivoted (rotated) about pivot 80 into a process chamber 10', overlying the wafer pedestal 14' as indicated in the dotted line (B position).

Figure 7B:
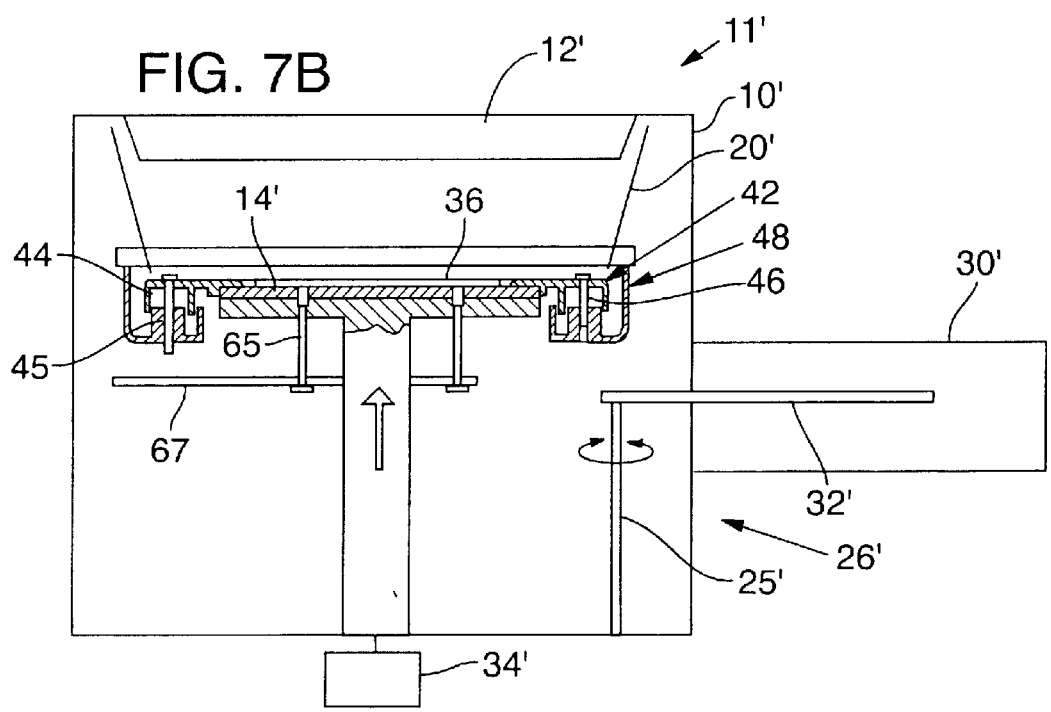
FIG. 7B is a cross-sectional view taken along lines 7B—7B in FIG. 8A with the shutter disk in a pasting position.

As shown in FIG. 7B, the shutter blade 32' is attached to the top of an actuator arm 25', forming a shutter arm assembly 26'. As the lift hoop 67 rises, lift hoop fingers 65 pick up the shutter disk 36 from the shutter blade 32' to raise the shutter disk 36 by a wafer lift 34'. (65, 67 not shown in FIG. 7A, but shown in FIG. 7B) Finally, the wafer pedestal 14' and the shutter disk 36 are raised to the pasting position shown in FIGS. 7B and 8B. Once the cleaning or pasting process has been completed, the shutter disk 36 is pivoted (rotated) back into the enclosure 30' using the shutter blade 32'. This lateral travel must be below the lower shield/cover ring assembly and above the wafer pedestal 14'.

As discussed, FIG. 7B shows a cross-sectional view of the present invention PVD chamber with the shutter disk 36 in the pasting position. Then, a pasting process is performed with the shutter disk 36 on the pasting position. As a result, the metal such as Ti for a glue layer—to secure the material layer such as titanium nitride already deposited and to provide an adherent surface for additional deposition—can be deposited onto the exposed surface of the process chamber 10'. A target 12' can be cleaned without contaminating the wafer pedestal 14'.

Referring to FIG. 8A, a top view of a present invention PVD chamber 10' is shown with the shutter disk in a "stored" position. At this time, the shutter disk 36 is housed in the enclosure 30' until there is a signal to rotate the shutter disk 36 into the process chamber 10' for a pasting process. Thus, the shutter disk 36 is not shown yet but the cover ring 42 with the tabs 40. In addition, the lower shield 48 is engaged with the cover ring 42. Also, the upper shield 20' is associated with the lower shield 48 to confine the ion bombardment to the target 12'.

FIG. 8B shows a top view of the PVD chamber 10' with the shutter disk 36 in a "pasting" position corresponding to FIG. 7B. As described above, the shutter disk 36 having notched areas 39 on the periphery thereof is placed complementary to the tabs 40 of the cover ring 42.

In conclusion, with the shutter disk 36 with notched areas 39 and the modified cover ring 42 with cups 50 formed on the upper portion of the lower shield 48, the present invention allows use of the shutter disk 36 and shutter arm assembly 26' without a clearance problem underneath the lower shield 48 and without a gluing problem in a tabbed alignment block-out scheme. Thus, the present invention can be fully automated, as opposed to requiring human intervention with the wafer-based pasting as in the prior art.

Importantly, because the shutter disk 36 is located immediately adjacent to the process chamber 10', the present invention represents a highly productive method, when contrasted with the prior art.

Although described in the context of sputtering apparatus, the present invention can be applied to any type of physical vapor deposition chamber using the tab block-out scheme described above.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A physical vapor deposition (PVD) chamber for tabbed block-out scheme, comprising:
   a cover ring having one or more tabs extending radially inwardly therefrom, and
   a shutter disk having one or more peripheral notched areas formed therein configured to receive the one or more tabs to keep a distance between the tab and the shutter disk.

2. The apparatus of claim 1, wherein the distance is approximately 0.1 to approximately 0.3 inches.

3. The apparatus of claim 1, wherein the cover ring includes two or more recesses formed in an upper side thereof with a guide pin extending from the center of the recesses to fix the cover ring and the tabs, and the shutter disk and notched areas in angular registration.

4. The apparatus of claim 3, wherein the lower shield includes two or more annular cups extending toward the cover ring and positioned to receive the guide pin, the depth of the recesses being approximately 0.9 inches to receive the cups.

5. A physical vapor deposition (PVD) system for tabbed block-out scheme, comprising:
   a chamber;
   an upper shield and a lower shield mounted within the chamber;
   a cover ring having one or more tabs extending radially inwardly therefrom; and
   a shutter disk having one or more notched areas formed on a periphery thereof to receive the one or more tabs of the cover ring so that the cover ring including the one or more tabs and the shutter disk do not contact each other.

6. The PVD system of claim 5, wherein the cover ring includes:
   two or more recesses formed in an upper side thereof with a guide pin extending from the center of the recesses; and
   the lower shield having two or more cups, each with a hole positioned therein to be engaged with the guide pin of the cover ring to keep the lower shield from rotating with respect to the cover ring, the cups of the lower shield protruding toward the cover ring to be inserted into the recesses of the cover ring.

7. The PVD system of claim 6, further comprising:
   a wafer pedestal mounted within the chamber;
   means for positioning the shutter disk to place the shutter disk on the wafer pedestal; and
   means for vertically adjusting the height of wafer pedestal.

* * * * *

UNITED STATES PATENT AND TRADEMARK OFFICE
CERTIFICATE OF CORRECTION

PATENT NO. : 6,736,946 B2
DATED : May 18, 2004
INVENTOR(S) : Hixson et al.

It is certified that error appears in the above-identified patent and that said Letters Patent is hereby corrected as shown below:

Title page,
Item [57], ABSTRACT,
Line 4, "The PAD system" should read -- The PVD system --.

Column 1,
Line 44, "can delaminated, flake" should read -- can delaminate, flake --.
Line 47, "such participation. This" should read -- such particulation. This --.

Column 2,
Line 16, "a reticule for" should read -- a reticle for --.
Line 29, "is Endure Model" should read -- is Endura Model --.
Line 30, "ENDURE®" should read -- ENDURA® --.

Column 3,
Lines 15 and 25, "for shattering can" should read -- for shuttering can --.
Line 38, "two-tab blackout scheme," should read -- two-tab blockout scheme, --.

Column 6,
Line 34, "ring 42 is' approximately" should read -- ring 42 is approximately --.

Signed and Sealed this

Eighth Day of February, 2005

JON W. DUDAS
*Director of the United States Patent and Trademark Office*